United States Patent
Heintel et al.

(10) Patent No.: US 9,658,542 B2
(45) Date of Patent: May 23, 2017

(54) OPTICAL ELEMENT

(71) Applicant: Carl Zeiss SMT GmbH, Oberkochen (DE)

(72) Inventors: Willi Heintel, Aalen (DE); Steffen Fritzsche, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 199 days.

(21) Appl. No.: 14/508,066

(22) Filed: Oct. 7, 2014

(65) Prior Publication Data
US 2015/0103326 A1  Apr. 16, 2015

(30) Foreign Application Priority Data
Oct. 14, 2013 (DE) .................. 10 2013 220 710

(51) Int. Cl.
G02B 7/02 (2006.01)
G03B 27/52 (2006.01)
G03F 7/20 (2006.01)

(52) U.S. Cl.
CPC ...... G03F 7/70891 (2013.01); G03F 7/70825 (2013.01)

(58) Field of Classification Search
CPC .................. G03F 7/70825; G03F 7/70891
USPC .............. 355/30, 67; 359/359, 820, 855
See application file for complete search history.

(56) References Cited

U.S. PATENT DOCUMENTS

| | | | |
|---|---|---|---|
| 2002/0074115 A1 | 6/2002 | Dieker | |
| 2006/0119815 A1* | 6/2006 | Franken | G03F 7/70291 355/53 |
| 2006/0187428 A1* | 8/2006 | Bleeker | G03F 7/70291 355/53 |
| 2007/0084461 A1 | 4/2007 | Box et al. | |
| 2007/0097346 A1* | 5/2007 | Maria Zaal | C04B 35/195 355/72 |
| 2011/0164232 A1* | 7/2011 | Freimann | G03F 7/70258 355/67 |
| 2011/0181852 A1 | 7/2011 | Bleidistel et al. | |

(Continued)

FOREIGN PATENT DOCUMENTS

| | | |
|---|---|---|
| DE | 100 50 125 A1 | 4/2002 |
| DE | 10 2011 006 100 A1 | 9/2012 |
| EP | 1 389 747 A2 | 2/2004 |

(Continued)

OTHER PUBLICATIONS

German Office Action, with translation thereof, for corresponding DE Appl No. 10 2013 220 710.7, dated Mar. 10, 2014.

*Primary Examiner* — Colin Kreutzer
(74) *Attorney, Agent, or Firm* — Fish & Richardson P.C.

(57) ABSTRACT

The disclosure relates to an optical assembly for a projection exposure apparatus for semiconductor lithography. The optical assembly includes at least one optical element and a mounting body for mechanically fixing the element in a supporting structure. The optical assembly also includes at least one cooling body for dissipating heat from the element. The mounting body and the cooling body are separate from one another. The optical element is connected to the cooling body via at least one heat-conducting element. The disclosure also relates to a projection exposure apparatus including an optical assembly according to the disclosure.

25 Claims, 5 Drawing Sheets

(56) References Cited

U.S. PATENT DOCUMENTS

2014/0055767 A1   2/2014   Waldis et al.

FOREIGN PATENT DOCUMENTS

EP    1 197 776 B1   10/2004
EP    1 477 850 A1   11/2004

* cited by examiner

OPTICAL ELEMENT

CROSS-REFERENCE TO RELATED APPLICATION

This application claims benefit under 35 U.S.C. §119 of German patent application No. 10 2013 220 710.7, filed Oct. 14, 2013, the entire contents of which are incorporated by reference herein.

FIELD

The disclosure relates to an optical assembly for a projection exposure apparatus for semiconductor lithography and to a projection exposure apparatus for semiconductor lithography.

BACKGROUND

Optical assemblies are often installed in a larger unit, such as for example an EUV illumination system. The optical element is in this case a three-dimensional geometrical body that is generally delimited by multiple surface areas and is used for performing one or more optical functions, such as for example the deflection or other manipulation of electromagnetic radiation. According to the optical beam path, the electromagnetic radiation is incident at least on one surface of the optical element. This surface is referred to hereinafter as the optically active surface. The optically active surface may be divided into multiple sub-surfaces, may be convexly or concavely curved in sub-portions and also include abrupt changes in topography, as are usual for example in the case of a diffractive optical structure. The optically active surface may include, among other things, a multilayer layer and/or other coatings, such as for example also an absorber layer. The multilayer layer may be formed via a contiguous coating vapour-deposited onto the optical element. The optically active surface may also be arranged on an MEM that is acting as an optical element. The individual optical elements may be constructed from different materials and/or generally also have different component geometries. During the operation of the illumination system, different illumination settings, such as for example an annular setting, a dipole, quadrupole or other multipole setting, can also be set by corresponding alignment of the optically active surface. This has the consequence that, depending on the illumination setting, electromagnetic radiation is incident on the optical elements with locally differing intensity. Furthermore, in the case of some of the optical elements considered here, locally differing absorber layers are applied. These absorber layers are used to achieve defined spatially resolved intensity distribution of the reflected radiation after the reflection of the EUV radiation at these optical elements. Depending on the degree of absorption of EUV radiation, the energy input at the optical elements may differ locally. During the operation of the illumination system, IR radiation from other optical elements or from mechanical components may also be incident on the optical element considered and be completely or partially absorbed there. The IR radiation may for example also originate from a heated component—such as for example a so-called sigma diaphragm—which has previously absorbed EUV radiation. Consequently, there may altogether be a locally differing heat distribution on the optically active surface of the optical elements. In particular, even with a homogeneous or symmetrical energy input, asymmetric local heat distributions may occur, if for example the absorption properties for electromagnetic radiation on the component differ in a spatially resolved manner. In the case where the optical elements are uncooled, sometimes temperatures of 200° C. and above can occur during the operation of the illumination systems. The spatially resolved heat distribution may result in undesired deformations of the optical elements or mounting bodies thereof. In particular when changing an illumination setting and when there is constant thermal loading over a certain period of time, deformations of the optical elements or the mounting bodies thereof may occur when considered over time in comparison with the basic state without thermal loading at ambient temperature, or some other previously set steady state or quasi steady state.

SUMMARY

The disclosure seeks to comparatively quickly dissipate heat from an optical element in an optical assembly, wherein the heat is produced in the optical assembly during operation. The disclose also seeks to provide the desired imaging performance of the optical system during operation and to provide a stable mounting of the optical elements.

According to the disclosure, an optical assembly may be for example a deflection mirror in an EUV illumination system for semiconductor lithography. Similarly, an optical assembly may also include multiple optical elements. For example, a facet mirror made up of a mirror supporting body and many individual mirror facets as optical elements is likewise referred to hereinafter as an optical assembly.

An optical assembly according to the disclosure, in particular for a projection exposure apparatus for semiconductor lithography, includes at least one optical element with a mounting body for mechanically fixing the optical element in a supporting structure and at least one cooling body for dissipating heat from the optical element. The mounting body and the cooling body are configured as components that are separate from one another. The optical element is connected to the cooling body via at least one heat-conducting element. An advantage of this measure is that of breaking down the complexity involved in the design, production and installation by providing the mounting body and the cooling body as separate structural units. It is likewise advantageous that a simple integration or arrangement of electrical or electronic components in or on the mounting body is made possible, since the mounting body is not flowed through directly by coolant. There is consequently altogether a lower integration density.

The mounting body may be produced by using a material with a comparatively low coefficient of thermal expansion, which may have a value in a range from $0.1 \times 10^{-6}$ m/m/K to $25 \times 10^{-6}$ m/m/K, and/or a comparatively high modulus of elasticity in a range from $70 \times 10^9$ N/m$^2$ to $600 \times 10^9$ N/m$^2$. The use of materials with the stated parameters has the effect that the mounting body is mechanically stable, and consequently undergoes little deformation. The high heat absorption in the optical elements consequently has virtually no influence on the mounting body in terms of deformation.

The material for the mounting body may contain Invar or Zerodur. It is advantageous that a low-expansion, stable mounting body can be achieved with these materials. Alternatively or in combination, the material for the mounting body may contain silicon carbide, molybdenum alloys, tungsten alloys, copper alloys, aluminium alloys or high-grade steels.

The optical element may be connected to the heat-conducting element and/or be arranged on it in direct physical contact. It is advantageous that no great installation forces are involved for the heat transfer within the mounting body, since installation takes place at or on the heat-conducting element. This avoids deformations of the mounting. The physical contact between the optical element and the heat-conducting element can be established by an adhesive bond.

It is ensured by the use of a heat-conducting element that the predominant part of the heat to be dissipated from the optical element is not dissipated by way of the supporting structure and/or the mounting body, but by way of the heat-conducting element itself. The supporting structure and/or the mounting body can consequently be optimized from purely mechanical aspects, in particular also with regard to material cross sections. This gives rise to extended possibilities in the construction and design of the optical arrangement with regard to mechanical securement.

The heat-conducting element may comprise a heat-conducting pipe, also known as a heat pipe. The heat-conducting element may contain copper, aluminium, gold or silver, possibly in corresponding alloys.

The heat pipe may contain water as the working liquid. An advantage of the use of a heat pipe is that the mechanical disadvantages of a pipeline or a tube through which water is actively pumped—in particular vibrations caused by the flow of the medium—occur very rarely in the case of the heat-conducting element. Other working liquids are also conceivable, depending on the working area and the temperature of the cooler.

In an advantageous implementation, the heat-conducting element may have a head part to be arranged on the optical element and/or an end part to be arranged on the cooling body. It is possible for the heat pipe to be arranged between the head part and the end part. The material for the head part may contain copper, high-grade steel, silicon, silicon carbide, molybdenum alloys or tungsten alloys. An advantage of these materials is that the head part can be designed with good thermal conductivity and adapted, preferably lower, thermal expansion. The material for the end part may contain copper, copper alloys, aluminium alloys, silicon carbide, molybdenum alloys or tungsten alloys. Good thermal conductivity is important for the end part and the head part, and is obtained from the aforementioned materials.

In an advantageous implementation, the heat-conducting element may be designed as one part. In this case, the one-part heat-conducting element may be produced at low cost as a soldering assembly.

The thermal resistance of the heat-conducting element may have a value in a range from 0.5 K/W to 5.0 K/W, preferably in a range from 0.5 K/W to 2.0 K/W. Great amounts of heat can be advantageously dissipated by way of the heat-conducting elements with low temperature gradients. For example, a heat pipe with a diameter of 4 mm that is operated with water can, depending on the working temperature range, transport 20 W to 35 W of heat output.

In an advantageous implementation, an additional part for fastening the head part may be arranged on the mounting body.

The heat pipe may have a flexible outer sheath. An advantage of the flexible heat-conducting elements is that they only transfer small forces to the mounting body when there are positional changes due to mechanical and/or thermal influences on their connection locations in the cooling body, these small forces in turn only having a small influence on the deformation of the mounting body. The heat-conducting element can consequently be configured as mechanically largely neutral, that is to say comparatively soft, so that no additional possibly disturbing forces are introduced into the mounting body and the optical element through the heat-conducting element.

In an advantageous implementation, the outer sheath may comprise a material with a modulus of elasticity with a value in the range from $15 \times 10^9$ N/m² to $220 \times 10^9$ N/m².

The heat-conducting element may be exchangeable. It is advantageous that, after the removal of the heat-conducting element, an in-situ repair or adaptation of the optical element is possible if a component or optical element is defective, or for exchanging it without dismantling the entire optical assembly. The components may be extractably arranged on the mounting body, so that the corresponding component could be extracted from the side of the optically active surface or from the side of the optical assembly that is facing away from the optically active surface, and then be exchanged or repaired in situ.

The heat transfer between the head part and the optical element or the mounting body and/or between the end part and the cooling body may take place by mechanical contact. In an advantageous way, the mechanical contact between these components may be established by a mechanical, magnetic or adhesive connection.

In an advantageous implementation of the disclosure, the head part may be designed such that it can be screwed into and unscrewed from or inserted into and withdrawn from or pushed into and extracted from the mounting body and/or the end part may be designed such that it can be screwed into and unscrewed from or inserted into and withdrawn from or pushed into and extracted from the cooling body.

The cooling body may be operated with liquid cooling, preferably water cooling, and/or the cooling body may be configured as a plate or strip cooler. The advantage of water is that it has a very low thermal resistance and transports the heat away very effectively, and consequently a lower temperature can be achieved at the optical element by water cooling. The cooling body may also be operated in the range below 0° C., preferably with glycol water cooling. In this way, a lower temperature can be achieved at the optical element.

In an advantageous implementation, the cooling body may be mountable on the supporting structure via vibration dampers and/or the cooling body may be arranged in such a way that it is isolated from the mounting body in terms of vibration.

The optical element may be a MEMS module or a mirror facet.

The advantage that is achieved by separating the mounting body and the cooling body is that of avoiding disturbing effects on the optical properties of the optical element considered. The thermal loading and in particular the heat distribution in the components can also change over time, for example if a change of the illumination setting is performed. The cooling used here, via heat-conducting elements, may be configured such that, apart from the local adaptation, it is additionally adaptive over time.

Furthermore, the optical elements of a module may be cooled to differing degrees. Furthermore, it is also possible to attach controllable cooling bodies to the heat-conducting elements, the cooling bodies having single or multiple locally adapted cooling zones, so that a locally adaptable and/or settable cooling of the optical elements is made possible.

The optical assembly may for example be a multilayer mirror for EUV lithography with a mirror support and a multilayer layer arranged thereon as an optical element. The multilayer mirror may be provided with at least one heat-conducting element. Various sub-regions of the mirror support may be connected to one or more heat-conducting elements and be cooled to varying degrees there.

The heat-conducting elements may also be formed as cooling lines connected to the cooling body. The heat-conducting elements configured as cooling lines are consequently separate components that are attached to the cooling body.

The optical element may also be cooled via a cooling body with the latter being in thermal contact with the optical element by way of heat-conducting elements, and a greater degree of cooling being achieved in a first sub-region by the contact surface between the heat-conducting element and the optical element being greater than in a further sub-region. The forming of heat-conducting elements that are adapted to the desired local cooling rate consequently represents a further alternative for the cooling of the optical element in various sub-regions. In this case, the entire configuration of the system can be adapted to new circumstances in an easy way by exchanging the heat-conducting elements.

The optical element may also be provided on the optically active surface with an EUV absorber layer, which has different thicknesses in different regions of the optically active surface. Application of the EUV absorber layer particularly allows locally adapted intensity modulation of the electromagnetic radiation that is incident on the optical element. A different degree of cooling is provided at the sub-regions of great thickness of the absorber layer in comparison with the sub-regions with a smaller thickness of the EUV absorber layer, on account of the greater energy input there.

The optical assembly may also be a facet mirror with a plurality of single mirror facets. A heat-conducting element may be arranged on at least one single mirror facet. The desired spatially resolved cooling is in this case achieved by individual or groups of single mirror facets being cooled to differing degrees.

The heat-conducting element may be integrated under an optically active surface, in particular a reflective surface of a single mirror facet or a multilayer layer, and can in this way dissipate particularly efficiently the heat that is produced.

BRIEF DESCRIPTION OF THE DRAWINGS

An exemplary embodiment of the disclosure is explained in more detail below on the basis of the drawings, in which.

DETAILED DESCRIPTION

Figure 1:
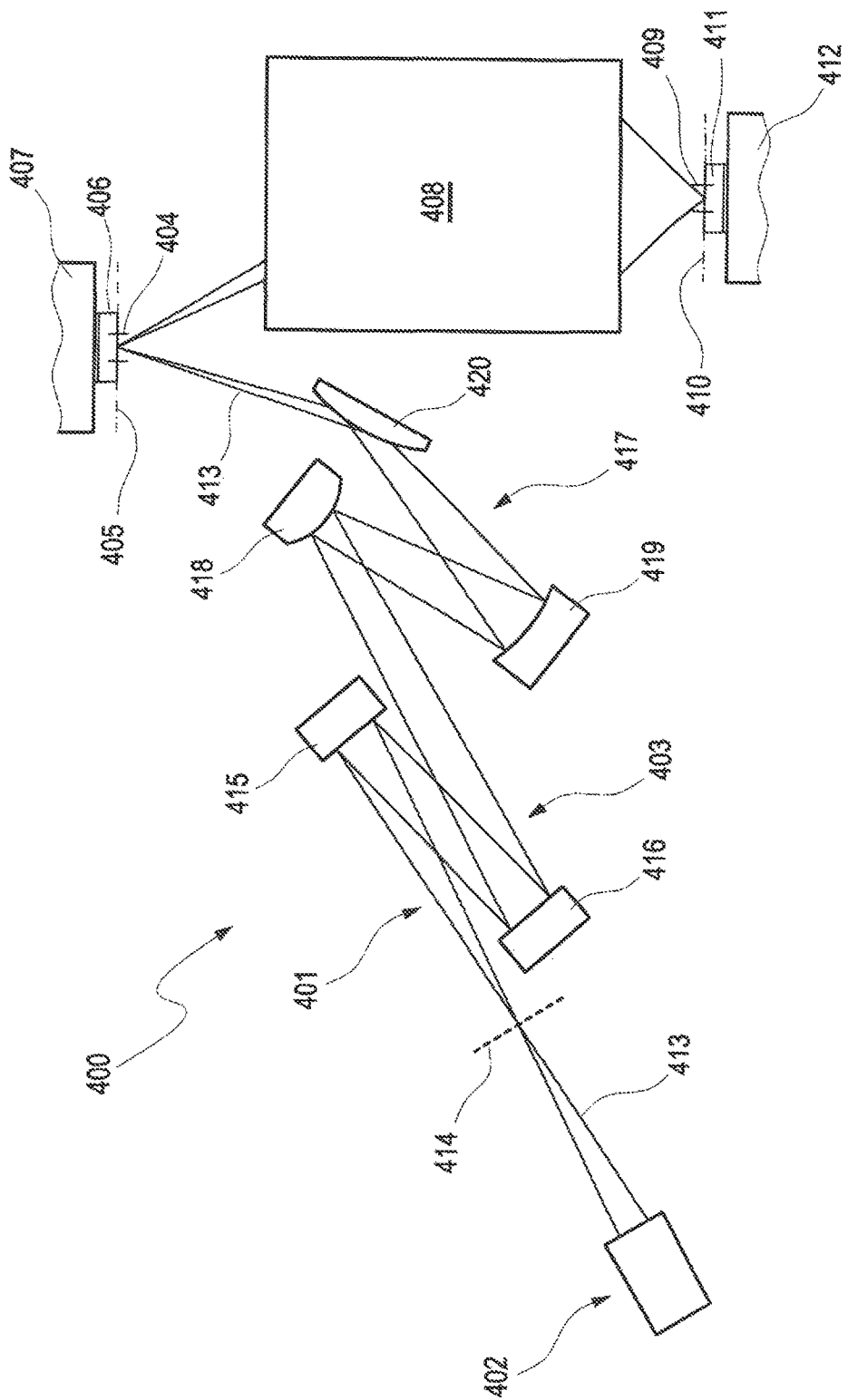
FIG. 1 shows a schematic representation of a projection exposure apparatus.

FIG. 1 shows by way of example the basic construction of a microlithographic EUV projection exposure apparatus 400. An illumination system 401 of the projection exposure apparatus 400 has along with a light source 402 an illumination optics 403 for illuminating an object field 404 in an object plane 405. A reticle 406, which is arranged in the object field 404 and is held by a schematically represented reticle holder 407, is illuminated. A projection optics 408, which is only schematically represented, serves for projecting an image of the object field 404 into an image field 409 in an image plane 410. An image of a structure on the reticle 406 is projected onto a light-sensitive layer of a wafer 411, which is arranged in the region of the image field 409 in the image plane 410 and is held by a wafer holder 412, which is likewise represented in the form of a detail. The light source 402 can emit used radiation, in particular in the range between 5 nm and 30 nm.

A EUV radiation 413 generated via the light source is aligned via a collector integrated in the light source 402 in such a way that it passes through an intermediate focus in the region of an intermediate focal plane 414 before it is incident on a field facet mirror 415. After the field facet mirror 415, the EUV radiation 413 is reflected by a pupil facet mirror 416. With the aid of the pupil facet mirror 416 and an optical assembly 417 with mirrors 418, 419 and 420, images of field facets of the field facet mirror 415 are projected into the object field 404.

Figure 2:
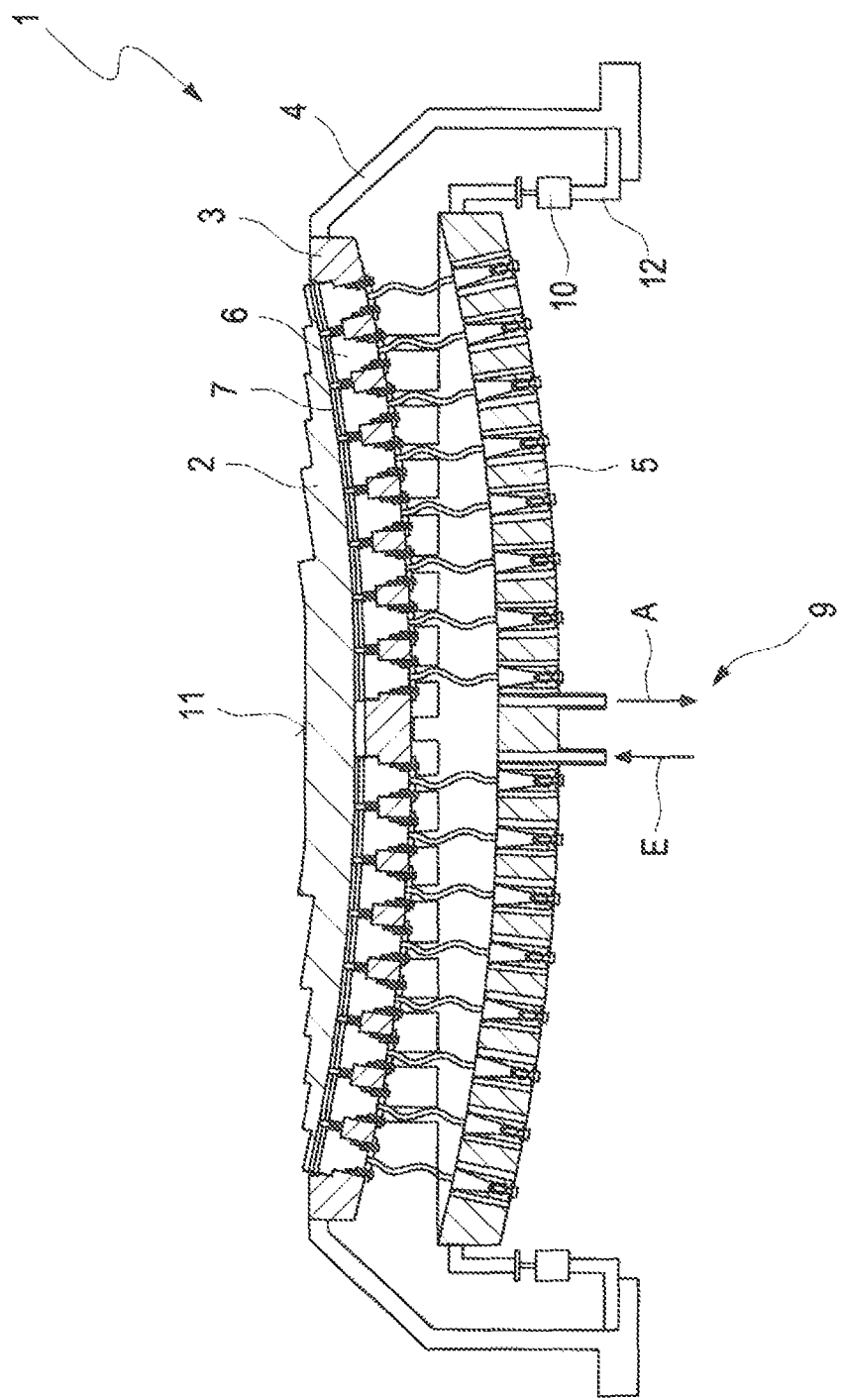
FIG. 2 shows a schematic cross-sectional representation of an optical assembly.

FIG. 2 shows an optical assembly 1 with an optical element 2, which has an optically active surface 11. The optical element 2 may also be designed (not represented) as a single mirror facet or MEMS module. Alternatively, the optical element 2 may—likewise not represented any more specifically—be constructed as a structural component with a plurality of MEMS modules and/or micro-mirrors and from various layers, electrical and/or electronic components being arranged on the various layers and the optically active surface being distributed over mirrors that are square, rectangular or of some other form.

For mechanical fixing, the optical element 2 is mounted in a mounting body 3. The mounting body 3 is supported by a supporting structure 4. The connection between the mounting body 3 and the supporting structure 4 may preferably be provided by adhesive bonding, clamping or screwing. The supporting structure 4 itself may be configured with the use of a hexapod (see FIG. 5). Suitable as the material for the supporting structure 4 are materials that preferably contain high-grade steel or aluminium.

For dissipating heat from the optical element 2 into a cooling body 5, the optical element 2 is connected to the cooling body 5 by way of at least one heat-conducting element 6. In the exemplary embodiment shown in the figure, the cooling body 5 is operated with water cooling 9; other cooling media, in particular glycol or the like, are also conceivable. The cooling medium flows through the cooling body, which dissipates the thermal energy transferred to it. The cooling medium enters the cooling body 5 at an inlet, the direction of flow being represented by the arrow E, and leaves the cooling body 5 at an outlet, the direction of flow being represented by the arrow A. The cooling body 5 may—not represented any more specifically—be configured as a plate or strip cooler. The cooling body 5 can be produced from a material that preferably may contain copper, aluminium, high-grade steel or alloys thereof.

The cooling body 5 is mounted on the supporting structure 4 by way of a holder 12, which in the example shown comprises a vibration damper 10.

Figure 3:
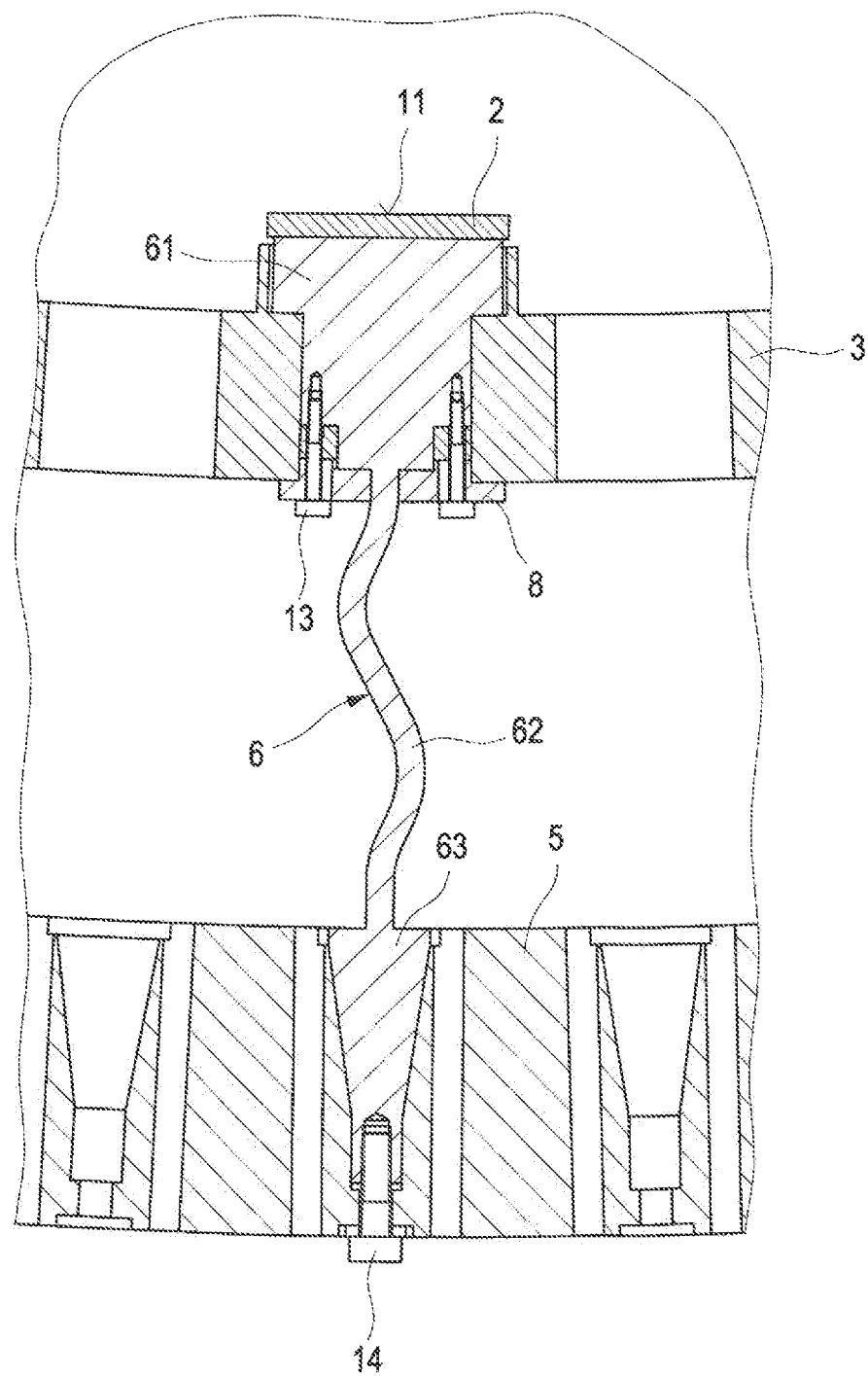
FIG. 3 shows a schematic representation of a partial detail of the optical assembly of FIG. 2.

FIG. 3 shows a view of a detail of the heat-conducting element 6 in the fitted state. The heat-conducting element 6 exhibits a head part 61, a heat-conducting pipe or heat pipe 62 and an end part 63. The heat pipe 62 is of a wavy configuration and, because of its form, small wall thickness and small cross section, has a residual flexibility. Consequently, it is possible with the heat pipe 62 to compensate for positional or installation-related tolerances and/or differences in thermal expansion between the components. In the example shown, the optical element 2 is arranged on the head part 61 directly, that is to say in particular is also thermally coupled. The optical element 2 may be in particular what is known as a brick, i.e. a MEMS module with micro-mirrors. The head part 61 may be fastened to the mounting body 3 by way of an additional part 8, for example a flange. The head part 61 is preferably tightened or clamped onto the mounting body 3 by the additional part 8 and a fastening element 13. The fastening element 13 may be configured as a screw. The fastening element 13 designed as a screw may—not represented any more specifically—be tightened or loosened by a tool that can be led through the cooling body 5 or through openings in the cooling body 5. After loosening and removing the screws and flange, which fix the head part 61 in the appropriate position on the mounting body 3, and after loosening the screw on the cooling body 5, the heat-conducting element 6 as a whole could for example be extracted upwards in the direction of the optically active surface 11.

Alternatively, the head part 61 may—not represented any more specifically—be connected directly to the mounting body 3, with no need for any additional screws 13 or additional parts 8. The mounting body 3 and the head part 61 are then connected to one another by mechanical contact. Furthermore, the head part 61 may—likewise not represented any more specifically—be fixedly connected to the mounting body 3, preferably by a welded or soldered connection.

The end part 63 is arranged on the cooling body 5. For this purpose, the end part 63 may be fastened to the cooling body 5 via a fastening element 14. The fastening element 14 may be configured as a screw. The end part 63 is connected to the cooling body 5 in direct physical contact. For this purpose, the end part 63 may be designed like a cone and the receptacle in the cooling body 5 for the end part 63 may be correspondingly designed as a counter-bearing. Alternatively, the end part 63 may—not represented any more specifically—be fixedly connected to the cooling body 5, preferably by a welded or soldered connection.

In order to obtain optimum thermal coupling between the cooling body 5 and the end part 63, a pressed surface that is as large as possible is desired between the components. This is obtained by the clamped connection via the cones or cone and counter-bearing, a surface that is as precise as possible and sufficiently large for establishing the mechanical contact between the cooling body 5 and the end part 63 being made possible via the cones.

The heat transfer from the optical element 2 into the cooling body 5 takes place by way of the heat-conducting element 6, these components from the optical element 2 to the cooling body 5 being in direct physical contact, i.e. the components are thermally coupled to one another. Moreover, the components are produced from materials with low thermal conduction resistances, in order to have overall a thermal conduction resistance that is as low as possible.

Figure 4:
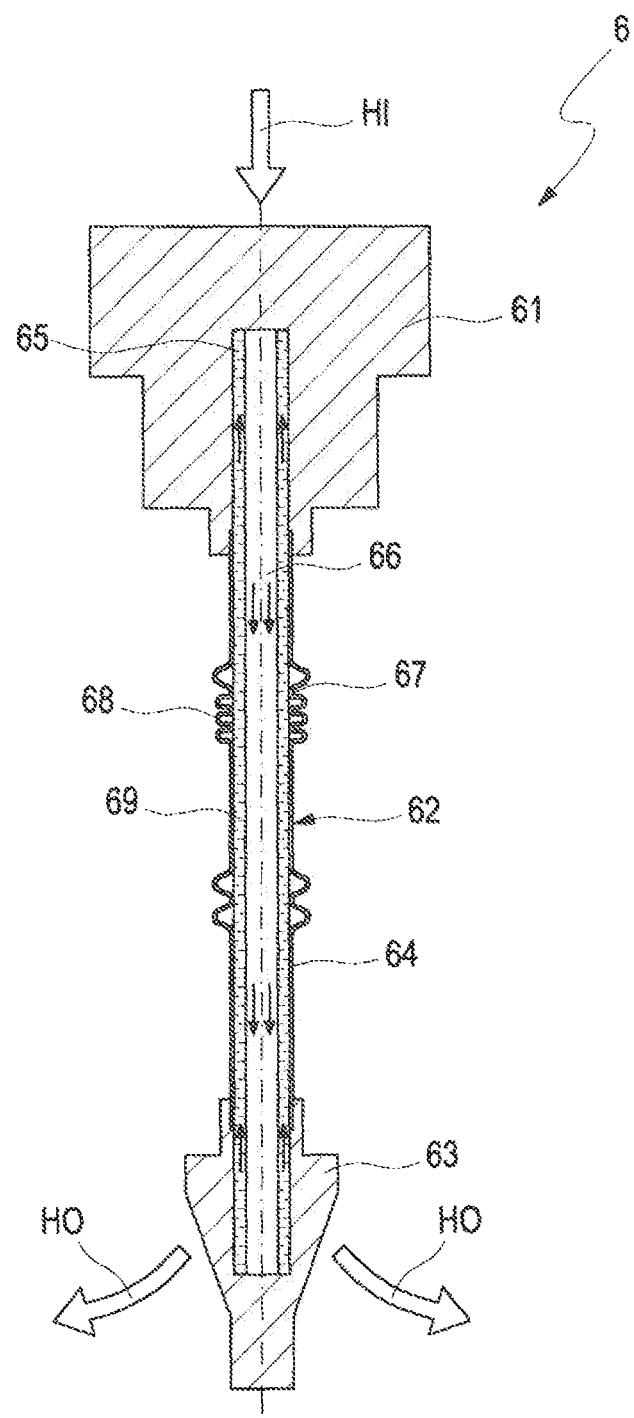
FIG. 4 shows a schematic representation of a heat-conducting element as a section of FIG. 3.

FIG. 4 shows a view of a detail of the heat-conducting element 6 in a sectional representation, which as a difference from the heat-conducting element 6 represented in FIG. 3 explains more specifically the interior construction and functioning of the heat pipe 62.

The heat pipe 62 is a sealed and/or closed pipe 64 with a working liquid 65 and the vapour 66 thereof. The pipe 64 may have a round or angular cross section and preferably contain as the material a metal that has a low thermal resistance. Materials that can be mentioned in particular as ones with good thermal conduction are copper, aluminium and silver, or else gold. Furthermore, improved heat conduction should also be taken into consideration when designing the cross section of the heat-conducting element. The inner side of the pipe 64 is provided with a capillary structure 69.

Alternatively, instead of the pipe 64, a flexible bellows could be used. The capillary structure 69 is in this case likewise flexible.

If heat is supplied to the heat pipe 62 from the outside, the liquid 65 inside the heat pipe 62 evaporates. A heat pipe 62 uses the working liquid 65 on the basis of the principle of latent heat of vaporization, the liquid 65 inside the heat pipe 62 being vaporized. The vapour 66 flows in the direction of the temperature gradient and condenses at the cooler locations of the heat pipe 62 in the region of the end part 63, while giving off the latent heat to the end part 63.

If heat is supplied to the heat pipe 62 by way of the head part 61, as indicated by the arrow HI, the liquid 65 evaporates at this location and a fraction of it then condenses again at a different location, preferably in the region of the end part 63. By this taking place, the latent heat of the working liquid 65 is used to bring about a very efficient energy transfer from the head part 61 to the end part 63. The heat has thus been transported to the end part 63 and can be dissipated, as indicated by the arrow HO.

The pipe 64 may be flexibly designed via joints 67 or bellows-like protuberances 68, in order to compensate for positional or installation-related tolerances and/or differences in thermal expansion between the parts.

Figure 5:
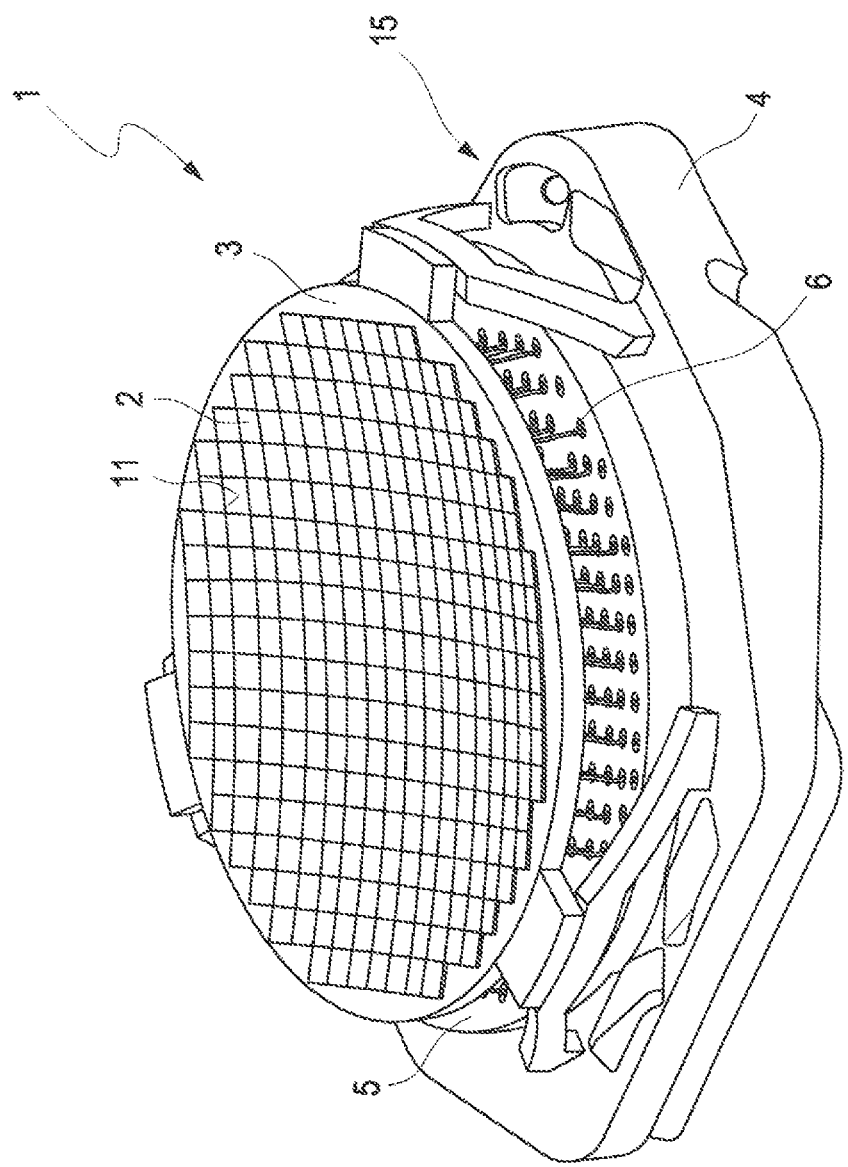
FIG. 5 shows an optical assembly in the overall representation that is shown in FIG. 2.

FIG. 5 shows the optical assembly 1, which as a difference from the optical assembly 1 represented in FIG. 2 has a supporting structure 4 with a hexapod connection 15. The supporting structure 4 has a hexagonal form, in order—not represented any more specifically—to position multiple optical elements with optimum utilization of the available installation space and the smallest possible distance from one another, for example in a mirror of a projection exposure apparatus.

What is claimed is:

1. An optical assembly, comprising:
   an optical element;
   a mounting body;
   a cooling body configured to dissipate heat from the optical element; and
   a heat conducting element that connects the optical element to the cooling body,
   wherein:
   the mounting body and the cooling body are separate from each other;
   the heat conducting element is mounted to the mounting body;
   the optical element is mounted to the heat conducting element; and
   the optical assembly is a semiconductor lithography optical assembly.

2. The optical assembly of claim 1, wherein the mounting body comprises a material having a coefficient of thermal expansion of from $0.1 \times 10^{-6}$ m/m/K to $25 \times 10^{-6}$ m/m/K.

3. The optical assembly of claim 1, wherein mounting body comprises high-grade steel or Zerodur.

4. The optical assembly of claim 1, wherein the optical element is in direct physical contact with the heat-conducting element.

5. The optical assembly of claim 1, wherein the heat-conducting element comprises a heat pipe.

6. The optical assembly of claim 5, wherein the heat pipe comprises a flexible outer sheath.

7. The optical assembly of claim 6, wherein the outer sheath comprises a material having a modulus of elasticity of from $15 \times 10^9$ N/m$^2$ to $220 \times 10^9$ N/m$^2$.

8. The optical assembly of claim 5, wherein the heat pipe contains water as a working liquid.

9. The optical assembly of claim 5, wherein:
the heat-conducting element comprises a head part and an end part;
the heat pipe is between the head part and the end part; and
at least one of the following holds:
the head part is in thermal contact with the optical element; and
the end part is arrangeable on the cooling body.

10. The optical assembly of claim 9, wherein the optical assembly is configured so that:
heat transfer between the head part and the optical element occurs via mechanical contact; and/or
heat transfer between the end part and the cooling body occurs via mechanical contact.

11. The optical assembly of claim 9, wherein at least one of the following holds:
the head part is screwable into and unscrewable from the mounting body;
the head part is insertable into and withdrawable from the mounting body;
the head part is pushable into and extractable from the mounting body;
the end part is screwable into and unscrewable the cooling body;
the head part is insertable into and withdrawable from the cooling body; and
the head part is pushable into and extractable from the cooling body.

12. The optical assembly of claim 9, further comprising an additional part configured to fasten the head part, wherein the additional part is on the mounting body.

13. The optical assembly of claim 1, wherein the heat-conducting element is a single part.

14. The optical assembly of claim 1, wherein the thermal resistance of the heat-conducting element is from 0.5 K/W to 5.0 K/W.

15. The optical assembly of claim 1, wherein the heat-conducting element is exchangeable.

16. The optical assembly of claim 1, wherein at least one of the following holds:
the cooling body is operatable with liquid cooling;
the cooling body is a plate cooler; and
the cooling body is a strip cooler.

17. The optical assembly of claim 1, wherein the cooling body mountable on the supporting structure via vibration dampers, and/or wherein the cooling body is vibrationally isolatable from the mounting body.

18. The optical assembly of claim 1, wherein the optical element comprises a MEMS module or a mirror facet.

19. The optical assembly of claim 1, wherein the optical assembly comprises a facet mirror which comprises a plurality of single mirror facets as optical elements.

20. The optical assembly of claim 1, wherein the optical assembly comprises a multilayer mirror.

21. The optical assembly of claim 1, wherein the heat-conducting element is under an optically active surface of the optical element.

22. An apparatus, comprising:
an optical assembly according to claim 1,
wherein the apparatus is a projection exposure apparatus for semiconductor lithography.

23. The optical assembly of claim 1, wherein the heat conducting element further comprises a flexible sheath, and the optical element is connected to the cooling body via the flexible sheath.

24. The optical assembly of claim 1, wherein:
the optical element comprises an optically active surface;
the heat-conducting element comprises a heat pipe; and
the heat pipe is under the optically active surface.

25. The optical assembly of claim 1, wherein:
the optical element comprises an optically active surface;
the heat-conducting element comprises a heat pipe and a flexible sheath; and
the flexible sheath is under the optically active surface.

* * * * *

UNITED STATES PATENT AND TRADEMARK OFFICE
CERTIFICATE OF CORRECTION

PATENT NO. : 9,658,542 B2  
APPLICATION NO. : 14/508066  
DATED : May 23, 2017  
INVENTOR(S) : Willi Heintel and Steffen Fritzsche Page 1 of 1

It is certified that error appears in the above-identified patent and that said Letters Patent is hereby corrected as shown below:

In the Claims

Column 9, Line 29, Claim 11, after "unscrewable", insert -- from --.

Signed and Sealed this  
Eighth Day of August, 2017

Joseph Matal  
*Performing the Functions and Duties of the*  
*Under Secretary of Commerce for Intellectual Property and*  
*Director of the United States Patent and Trademark Office*